(12) United States Patent
Yang et al.

(10) Patent No.: US 12,170,035 B2
(45) Date of Patent: Dec. 17, 2024

(54) DISPLAY MODULE, METHOD OF FABRICATING THE SAME, AND BACK FILM

(71) Applicants: Chengdu BOE Optoelectronics Technology Co., Ltd., Sichuan (CN); BOE TECHNOLOGY GROUP CO., LTD., Beijing (CN)

(72) Inventors: Shuquan Yang, Beijing (CN); Liqiang Chen, Beijing (CN); Chao Yang, Beijing (CN); Dongdong Zhao, Beijing (CN); Shengxing Zhang, Beijing (CN); Mengyuan Pang, Beijing (CN)

(73) Assignees: Beijing BOE Technology Development Co., Ltd., Beijing (CN); Chengdu BOE Optoelectronics Technology Co., Ltd., Sichuan (CN)

(*) Notice: Subject to any disclaimer, the term of this patent is extended or adjusted under 35 U.S.C. 154(b) by 294 days.

(21) Appl. No.: 17/535,611

(22) Filed: Nov. 25, 2021

(65) Prior Publication Data

US 2022/0293016 A1    Sep. 15, 2022

(30) Foreign Application Priority Data

Mar. 11, 2021  (CN) .......................... 202110265899.X

(51) Int. Cl.
*G09F 9/30* (2006.01)
*H10K 50/80* (2023.01)
(Continued)

(52) U.S. Cl.
CPC ........... *G09F 9/301* (2013.01); *H10K 50/868* (2023.02); *H10K 71/00* (2023.02); *H10K 2102/311* (2023.02)

(58) Field of Classification Search
CPC ...... G09F 9/301; H10K 71/00; H10K 50/868; H10K 2102/311
See application file for complete search history.

(56) References Cited

U.S. PATENT DOCUMENTS 11,068,029 B2 *  7/2021  Jeong .................... G06F 1/1652
11,114,426 B2 *  9/2021  Wang .................... H10K 59/131
(Continued)

FOREIGN PATENT DOCUMENTS

CN         109559644 A        4/2019
CN         109994606 A  *     7/2019  ............. G09F 9/335
(Continued)

OTHER PUBLICATIONS

China Patent Office, First Office Action dated May 16, 2022, for corresponding Chinese application 202110265899.X.

*Primary Examiner* — Rockshana D Chowdhury
*Assistant Examiner* — Martin Antonio Asmat Uceda
(74) *Attorney, Agent, or Firm* — HOUTTEMAN LAW LLC

(57) ABSTRACT

A display module includes a flexible display panel and a bearing structure. The flexible display panel includes a display part and a fan-out part coupled to the display part. The bearing structure includes a first bearing film and a first supporting structure. The first bearing film is at a non-light-emitting side of the flexible display panel, covers the display part and the fan-out part, and is configured to bear the flexible display panel. The first supporting structure is at a side of the first bearing film away from the flexible display panel. An orthographic projection of the first supporting structure on the flexible display panel is within an area where the fan-out part is located and at one end away from the display part, and the first supporting structure supports a
(Continued)

portion of the fan-out part of the flexible display panel and a portion of the first bearing film.

11 Claims, 10 Drawing Sheets

(51) Int. Cl.
*H10K 71/00* (2023.01)
*H10K 102/00* (2023.01)

(56) References Cited

U.S. PATENT DOCUMENTS

| | | | |
|---|---|---|---|
| 11,169,403 B2* | 11/2021 | Li | G09F 9/301 |
| 11,812,651 B2* | 11/2023 | Kim | H10K 50/86 |
| 11,837,118 B2* | 12/2023 | Park | G09F 9/301 |
| 2012/0177896 A1* | 7/2012 | Namikawa | H10K 77/111 |
| | | | 156/247 |
| 2017/0157431 A1 | 6/2017 | Cheatham, III et al. | |
| 2017/0215288 A1* | 7/2017 | Shi | H05K 3/007 |
| 2018/0081399 A1* | 3/2018 | Kwon | G09G 5/00 |
| 2019/0051858 A1 | 2/2019 | Tomioka et al. | |
| 2020/0174526 A1* | 6/2020 | Jeong | G06F 1/1626 |
| 2020/0185641 A1* | 6/2020 | Jeong | H10K 77/111 |
| 2022/0020823 A1* | 1/2022 | Kim | H10K 71/00 |
| 2022/0376205 A1* | 11/2022 | Gu | H10K 50/841 |

FOREIGN PATENT DOCUMENTS

| | | | |
|---|---|---|---|
| CN | 110515499 A | 11/2019 | |
| CN | 110890025 A | 3/2020 | |
| CN | 111028682 A | 4/2020 | |

* cited by examiner

DISPLAY MODULE, METHOD OF FABRICATING THE SAME, AND BACK FILM

CROSS-REFERENCE TO RELATED APPLICATION

The present application claims priority to Chinese Patent Application No. 202110265899.X, filed on Mar. 11, 2021, the contents of which are incorporated herein by reference in the entirety.

TECHNICAL FIELD

The present disclosure relates to the field of display technology, and particularly to a display module and a method of fabricating the same, and a back film.

BACKGROUND

Organic light-emitting diode (OLED) flexible display devices have the advantages of small volume, portability, capability of being folded and bent, narrow bezel and the like, and thus become the mainstream development trend of the display devices at present. In an OLED flexible display device, a back film is disposed at the back of a flexible display panel, and in order to realize a narrower bottom bezel of the OLED flexible display, generally, one side of the flexible display panel on which a driving integrated circuit (IC) is attached is bent to the back of the flexible display module in a manner of bending the flexible display panel at a deformation region. In this way, during the bending at the bending region, the back film is disposed on the back of the flexible display panel, so that supporting force can be provided for the flexible display panel to achieve a better bending effect.

SUMMARY

In an aspect, an embodiment of the present application provides a display module. The display module includes a flexible display panel and a bearing structure. The flexible display panel includes a display part and a fan-out part coupled to the display part. The bearing structure includes a first bearing film and a first supporting structure. The first bearing film is at a non-light-emitting side of the flexible display panel, covers the display part and the fan-out part, and is configured to bear the flexible display panel. The first supporting structure is at a side of the first bearing film away from the flexible display panel, and an orthographic projection of the first supporting structure on the flexible display panel is within an area where the fan-out part is located and at one end of the flexible display panel away from the display part, and the first supporting structure is configured to support a portion of the fan-out part of the flexible display panel and a portion of the first bearing film.

In some embodiments, the display module further includes a bendable element, a first end of the bendable element is coupled to the fan-out part, a second end of the bendable element opposite to the first end is provided with a driving chip thereon, and the bendable element is configured such that the driving chip is on the non-light-emitting side of the flexible display panel when the bendable element is in a bent state. The first supporting structure is on a portion of the first bearing film adjacent to the bendable element to support a portion of the fan-out part adjacent to the bendable element and the portion of the first bearing film adjacent to the bendable element.

In some embodiments, the first supporting structure includes a first covering layer and a first ultraviolet adhesive. The first ultraviolet adhesive is between the first covering layer and the first bearing film, and configured to attach the first covering layer to the first bearing film.

In some embodiments, the flexible display panel further includes: a bonding part configured to bond the driving chip; and a bending part between the bonding part and the fan-out part and coupled to the bonding part and the fan-out part, the bending part serving as the bendable element of the display module. The driving chip is on at least a portion of a first surface of the bonding part. The bearing structure further includes: a second bearing film on a second surface of the bonding part opposite to the first surface, and configured to bear the bonding part; a second supporting structure on a side of the second bearing film away from the bonding part, and configured to support the bonding part; and an opening between the first bearing film and the second bearing film, wherein the opening is defined by a first side wall of the first bearing film and a second side wall of the second bearing film opposite to the first side wall of the first bearing film, and an orthographic projection of the opening on the flexible display panel covers the bending part.

In some embodiments, the second supporting structure includes a second covering layer and a second ultraviolet adhesive. The second ultraviolet adhesive is between the second covering layer and the second bearing film and configured to attach the second covering layer to the second bearing film.

In some embodiments, the display module further includes a mechanical strength enhancement layer. The mechanical strength enhancement layer is on a side of the first bearing film away from the flexible display panel, and an orthographic projection of the mechanical strength enhancement layer on the flexible display panel does not overlap with the orthographic projection of the first supporting structure on the flexible display panel, and the mechanical strength enhancement layer is configured to support the flexible display panel.

In some embodiments, in a case where the bearing structure includes the second supporting structure, the display module further includes a spacer layer, which is between the mechanical strength enhancement layer and the second covering layer in a vertical direction in a case where the bending part is in the bent state.

In some embodiments, the bendable element is a chip on film having one end bonded to a surface of the fan-out part at a light-emitting side of the flexible display panel, and the other end configured to bond the driving chip. An orthographic projection of a portion of the chip on film, that is bonded to the fan-out part, on the fan-out part overlaps with an orthographic projection of the first supporting structure on the fan-out part.

In some embodiments, the display module further includes a polarizer and a cover plate on the light-emitting side of the flexible display panel and sequentially away from the flexible display panel.

In another aspect, an embodiment of the present application provides a back film. The back film includes a first film layer and a second film layer sequentially stacked and coupled to each other. The first film layer includes a first portion and a second portion spaced apart from each other with a gap therebetween. The second film layer includes a protective film and an ultraviolet adhesive layer that are stacked, and a viscosity of the ultraviolet adhesive layer varies with ultraviolet irradiation.

In some embodiments, the back film further includes an additional film layer adhering to a side of the first film layer away from the second film layer in a removable manner.

In another aspect, an embodiment of the present application provides a method of fabricating a display module, where the display module is the display module described above, and the first supporting structure of the display module includes a first covering layer and a first ultraviolet adhesive between the first covering layer and the first bearing film. The method includes steps of: providing a back film on the non-light-emitting side of the flexible display panel, where the back film is the back film as described above; irradiating a side of the back film away from the flexible display panel with ultraviolet light by using a mask to form a first viscosity region and a second viscosity region in the ultraviolet adhesive layer, wherein a first portion of the ultraviolet adhesive layer in the first viscosity region has a lower viscosity than that of a second portion of the ultraviolet adhesive layer in the second viscosity region; removing the first portion of the ultraviolet adhesive layer and a portion of the protective film that is attached to the first portion of the ultraviolet adhesive layer; and reserving the second portion of the ultraviolet adhesive layer as the first ultraviolet adhesive, and reserving a portion of the protective film that is attached to the second portion of the ultraviolet adhesive layer as the first covering layer.

In some embodiments, the flexible display panel further includes: a bonding part configured to bond the driving chip; and a bending part between the bonding part and the fan-out part and coupled to the bonding part and the fan-out part. The driving chip is on at least a portion of a first surface of the bonding part, and the bending part is configured such that the driving chip is on the non-light-emitting side of the flexible display panel when the bending part is in a bent state. The bearing structure further includes: a second bearing film on a second surface of the bonding part opposite to the first surface, and configured to bear the bonding part; a second supporting structure on a side of the second bearing film away from the bonding part, and configured to support the bonding part; and an opening between the first bearing film and the second bearing film, where the opening is defined by a first side wall of the first bearing film and a second side wall of the second bearing film opposite to the first side wall of the first bearing film, and an orthographic projection of the opening on the flexible display panel covers the bending part. The step of irradiating a side of the back film away from the flexible display panel with ultraviolet light by using a mask further includes: irradiating the side of the back film away from the flexible display panel with ultraviolet light by using a mask to form a third viscosity region in the ultraviolet adhesive layer, where a third portion of the ultraviolet adhesive layer in the third viscosity region has the same viscosity as that of the first portion of the ultraviolet adhesive layer in the first viscosity region. After the step of irradiating with ultraviolet light, the method further includes steps of: reserving the third portion of the ultraviolet adhesive layer as the second ultraviolet adhesive, and reserving a portion of the protective film attached to the third portion of the ultraviolet adhesive layer as the second covering layer.

In some embodiments, the first film layer is attached to the non-light-emitting side of the flexible display panel.

In some embodiments, the ultraviolet adhesive layer includes a material whose viscosity increases with ultraviolet irradiation. The step of irradiating a side of the back film away from the flexible display panel with ultraviolet light by using a mask includes: covering portions of the ultraviolet adhesive layer where the first and third viscosity regions are to be formed with the mask, and exposing a portion of the ultraviolet adhesive layer where the second viscosity region is to be formed to be irradiated with ultraviolet light.

In some embodiments, the ultraviolet adhesive layer includes a material whose viscosity decreases with ultraviolet irradiation. The step of irradiating a side of the back film away from the flexible display panel with ultraviolet light by using a mask includes: covering a portion of the ultraviolet adhesive layer where the second viscosity region is to be formed with the mask, and exposing portions of the ultraviolet adhesive layer where the first and third viscosity regions are to be formed to be irradiated with ultraviolet light.

BRIEF DESCRIPTION OF DRAWINGS

The accompanying drawings, which constitute a part of the specification, are provided for further understanding of the present disclosure, and for explaining the present disclosure together with the following specific implementations, but not intended to limit the present disclosure. In the drawings.

DETAILED DESCRIPTION

Hereinafter, technical solutions in embodiments of the present application will be described clearly and completely with reference to the drawings in the embodiments of the present application. It is apparent that the described embodiments are only some but not all embodiments of the present application. All other embodiments obtained by a person of ordinary skill in the art based on the embodiments in the present application without any creative effort belong to the protection scope of the present application.

In the following, the terms "first", "second", etc. are used for descriptive purposes only and are not to be construed as indicating or implying relative importance or as implying any indication of the number of technical features indicated. Thus, a feature defined with "first," "second," etc. may explicitly or implicitly include one or more said features.

In this application, unless expressly stated or limited otherwise, the term "coupled" is to be construed broadly, and may for example be coupled by direct contact or by indirect non-contact through intervening media.

The embodiments of the application provide a display module, which can be applied to a display device such as a television, a mobile phone, a computer, a notebook computer, a tablet computer (Pad), a personal digital assistants (PDA), a vehicle-mounted computer, or the like, which is not limited by the present application.

The display module may include an OLED display panel, a quantum-dot light emitting diode (QLED) display panel, or the like. The OLED display panel has the advantages of small size, portability, capability of being bent and folded, narrow bezel and the like, and is increasingly applied to the field of high-performance display. The following embodiments of the present application are all explained by taking an example that the display module includes an OLED display panel, but it is not limited thereto.

On this basis, in a case where the substrate in the OLED display panel is made of a flexible substrate material, the OLED display panel may be a flexible display panel. The following embodiments of the present application are all explained by taking an OLED display panel that is a flexible display panel as an example.

It should be noted that the flexible substrate material may include one or more of polyethylene terephthalate (PET), polyethylene naphthalate two formic acid glycol ester (PEN), polyimide (PI), and the like, which is not limited in the embodiments of the present application.

Figure 1:
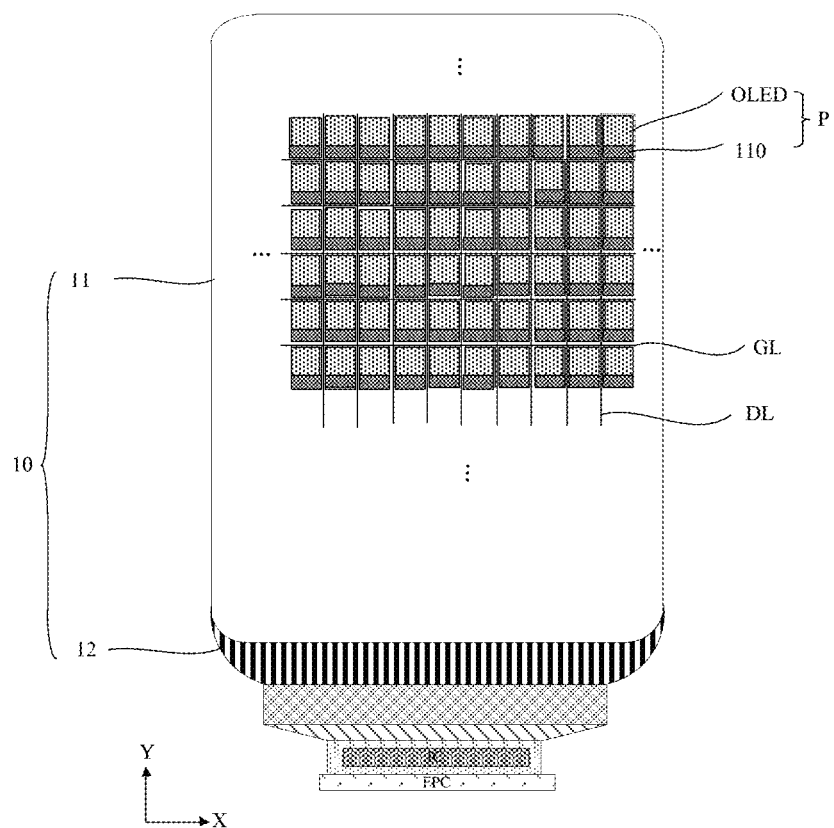
FIG. 1 is a schematic structural diagram of a display module according to an embodiment of the present disclosure.

In some embodiments of the present application, as shown in FIG. 1, the display module 100 may include a flexible display panel 10. The flexible display panel 10 may include a display part 11 (namely, an active area, AA).

As shown in FIG. 1, the display part 11 may include a plurality of subpixels P of multiple colors, each subpixel P is provided with a pixel circuit 110 and a light emitting device OLED electrically coupled to the pixel circuit 110, and the pixel circuit 110 may drive the light emitting device OLED to emit light. In this case, the OLEDs in the plurality of subpixels may emit light of at least three primary colors, for example, red (R), green (G), and blue (B).

For convenience of description, the present application is described by taking a case where the plurality of subpixels P are arranged in a matrix as an example. In this case, the subpixels P arranged in one row along the first direction X are referred to as subpixels in the same row, and the subpixels P arranged in one column along the second direction Y are referred to as subpixels in the same column.

The display part 11 may further include a plurality of data lines (DLs) and a plurality of gate lines (GLs). The pixel circuits 110 of the subpixels P in the same row may be electrically coupled to the same gate line GL. The pixel circuits 110 of the subpixels P in the same column may be electrically coupled to the same data line DL.

In the case where the pixel circuit 110 is gated by the gate signal transmitted through the gate line GL, the data signal may be written to the pixel circuit 110 through the data line DL. As such, the pixel circuit 110 may drive the light emitting device OLED electrically coupled to the pixel circuit 110 to emit light, so that the display module 100 displays an image.

In order to provide the data signals and the gate signals, as shown in FIG. 1, the display module 100 may further include a driving IC and a flexible printed circuit (hereinafter, referred to as FPC). The FPC couples a control main board (not shown) to the flexible display panel 10. The control main board may supply the gate signals to the pixel circuits 110 through the FPC. In addition, the driving IC may supply the data signals to the pixel circuits 110 under the control of the control main board.

Figure 2:
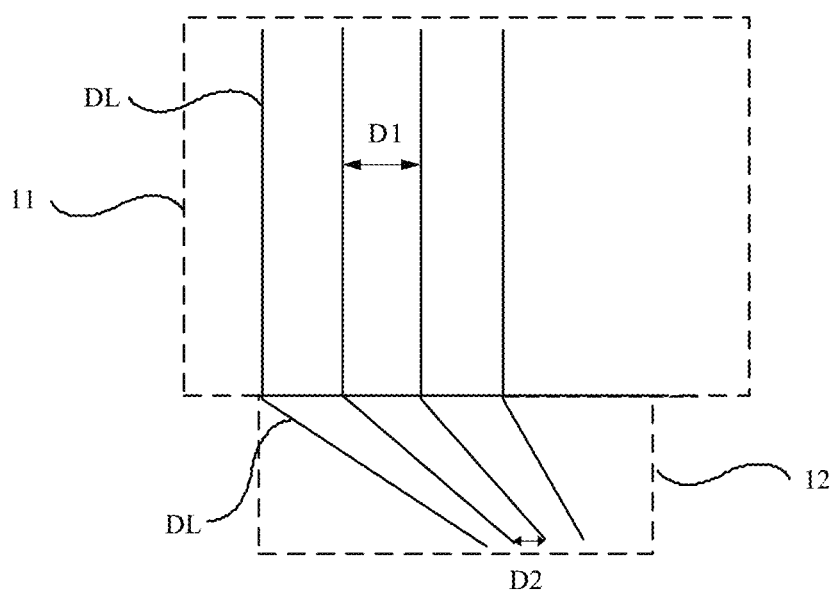
FIG. 2 is a schematic diagram illustrating a routing design of a fan-out part according to an embodiment of the present disclosure.

In order to facilitate the electric coupling of the data lines DL and the driving IC, as shown in FIG. 1, the flexible display panel 10 may further include a fan-out part 12 coupled to the display part 11. On a side of the fan-out part 12 close to the driving IC, a distance between any two adjacent data lines DL among the plurality of data lines DL decreases gradually. Exemplarily, as shown in FIG. 2, a distance D1 between any two adjacent data lines DL in the display part 11 is greater than a distance D2 between the two adjacent data lines DL in the fan-out part 12. As such, by providing the fan-out part 12 in the flexible display panel 10, it is possible to facilitate electric coupling of the plurality of data lines DL and the driving IC having a small volume.

It should be noted that, the fan-out part 12 may further include other signal lines besides the data lines DL, for example, the fan-out part 12 may further include a first power line VDD (not shown in FIG. 1) and a second power line VSS (not shown in FIG. 1), the first power line VDD may provide the pixel circuit 110 with the first voltage VDD, and the second power line VSS may provide the pixel circuit 110 with the second voltage VSS.

In the embodiments of the present application, the driving IC and the flexible display panel 10 may be coupled in two different manners, so that the display module 100 has two different structures. The following description will be given by taking the display module 100 with the two different structures as an example.

Figure 3A:
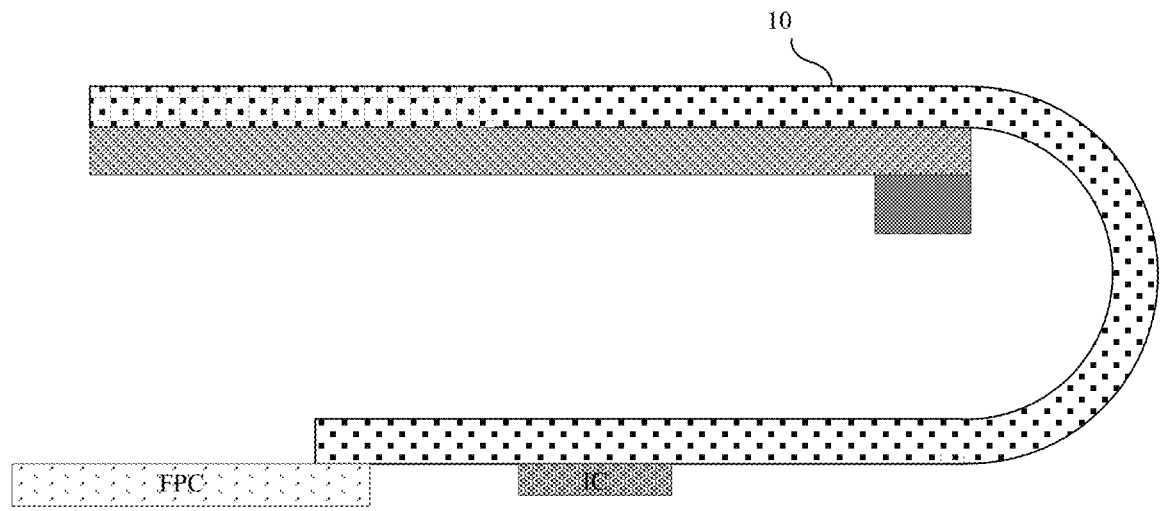
FIG. 3A is a schematic structural diagram of a display module according to an embodiment of the present disclosure.

FIG. 3A shows a first structure of the display module 100 according to an embodiment of the present application. As shown in FIG. 3A, the driving IC is electrically coupled to the flexible display panel 10 (chip on panel, COP for short) directly, and a portion of the flexible display panel 10 on which the driving IC is provided is directly bent to the non-light-emitting side of the display module 100. By the bending process, a narrow-bezel design of the display device having the display module 100 can be implemented.

Figure 3B:
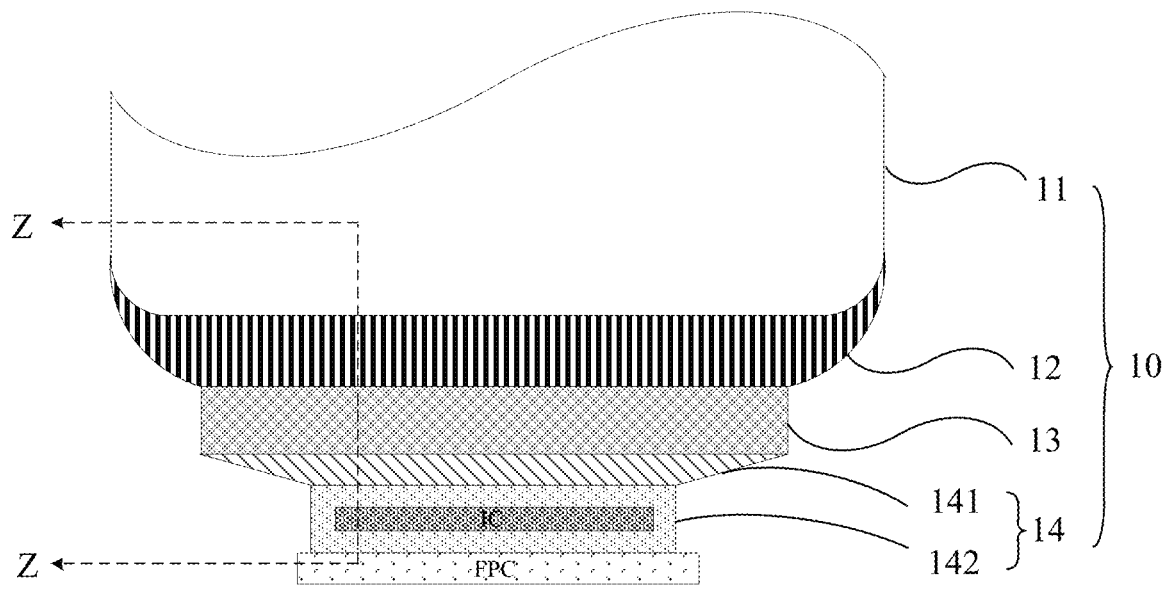
FIG. 3B is an expanded view of the display module shown in FIG. 3A.

Specifically, as shown in FIG. 3B, which is an expanded view of the display module 100 shown in FIG. 3A, the flexible display panel 10 may further include a bending part 13 and a bonding part 14. The bending part 13 is located between the fan-out part 12 and the bonding part 14, one end of the bending part 13 is coupled to the fan-out part 12, and the other end of the bending part 13 is coupled to the bonding part 14, and the bending takes place at the bending part 13. The bonding part 14 is configured to bond the driving IC as well as the FPC. The bending part 13 may bend the bonding part 14 provided with the driving IC and the FPC to the non-light-emitting side of the display module 100 when it is in a bent state.

In addition, since the data lines DL led out from the fan-out part 12 are not narrowed at the position of the bending part 13, that is, the distance between any two adjacent data lines DL in the bending part 13 is equal, the bonding part 14 may include a wire-narrowing portion 141 as shown in FIG. 3B in order to bond and electrically couple the data lines DL to the driving IC. The distance between any two adjacent data lines DL in the wire-narrowing portion 141 gradually decreases in a direction close to the driving IC, and the arrangement manner of the data lines DL is similar to that of the data lines DL in the fan-out part 12, which is not repeated herein. As such, the data lines DL and the driving IC can be electrically coupled through the wire-narrowing portion 141. In addition, the bonding part 14 may further include a bonding connection portion 142. The bonding connection portion 142 is configured to bond the driving IC and the FPC.

Figure 4A:
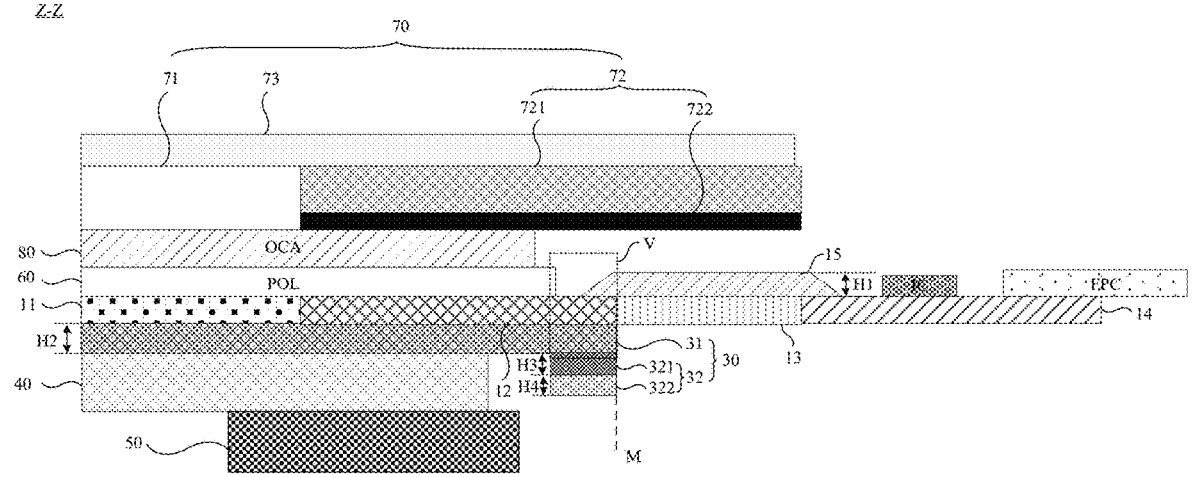
FIG. 4A is a cross-sectional view of the display module shown in FIG. 3B taken along a Z-Z direction.

In some embodiments of the present application, as shown in FIG. 4A, which is a cross-sectional view of the display module 100 shown in FIG. 3B taken along the Z-Z direction), in order to prevent the metal traces (not shown in FIG. 4A) in the bending part 13 from being broken due to a large stress produced when the bending part 13 is bent, the display module 100 may further include a stress compensation layer 15. The stress compensation layer 15 covers the bending part 13 and portions of the fan-out part 12 and the bonding part 14 that are close to the bending part 13.

As such, by providing the stress compensation layer 15 in the display module 100, the stress applied to the bending part 13 during the bending process can be adjusted, and the possibility of breakage of the metal traces in the bending part 13 in the bent state is reduced.

It should be noted that, in the embodiments of the present application, the thickness H1 of the stress compensation layer 15 may have a range as follows: 70 μm≤H1≤110 μm. When the thickness H1 of stress compensation layer 15 is less than the stress compensation layer 15 is too thin to properly adjust the stress produced in the bending process of the bending part 13. When the thickness H1 of stress compensation layer 15 is greater than 110 μm, the stress compensation layer 15 is so thick that resources are wasted and the assembly condition of the display module cannot be satisfied while the bending process is made difficult. Exemplarily, the thickness H1 of the stress compensation layer 15 may be 80 μm, 90 μm, or 100 μm. In this case, the stress compensation layer 15 not only can properly adjust the stress produced in the bending process of the bending part 13, but also can satisfy the assembly condition of the display module. In addition, in some embodiments of the present application, the material of the stress compensation layer 15 may be an ultraviolet adhesive.

As can be seen from the above, the substrate of the flexible display panel 10 is made of a flexible material, so that the flexible display panel 10 is easily deformed, which results in the breakage of signal traces (e.g., data lines DLs), thereby causing display defects. Thus, in order to prevent the flexible display panel 10 from being deformed, in some embodiments of the present application, as shown in FIG. 4A, the display module 100 may further include a bearing structure 30. The bearing structure 30 may include a first bearing film 31 and a first supporting structure 32. The first bearing film 31 is on the non-light-emitting side of the flexible display panel 10, and covers the display part 11 and the fan-out part 12, so as to bear the display part 11 and the fan-out part 12 and prevent the display part 11 and the fan-out part 12 from being deformed.

In some embodiments of the present application, the thickness H2 of the first bearing film 31 may have a range as follows: 30 μm≤H2≤120 μm. When the thickness H2 of the first bearing film 31 is less than 30 μm, the first bearing film 31 is too thin to well support the display part 11 and the fan-out part 12 thereon, and when the thickness H2 of the first bearing film 31 is greater than 120 μm, the first bearing film 31 is so thick that the fabrication cost increases and it is not favorable for the light and thin design of the display device. Exemplarily, the thickness H2 of the first bearing film 31 may be 50 μm, 75 μm, or 100 μm. As such, the first bearing film 31 not only can well support the display part 11 and the fan-out 12 located on the first bearing film 31, but also has a lower cost and realizes the light and thin design of the display device.

Figure 4B:
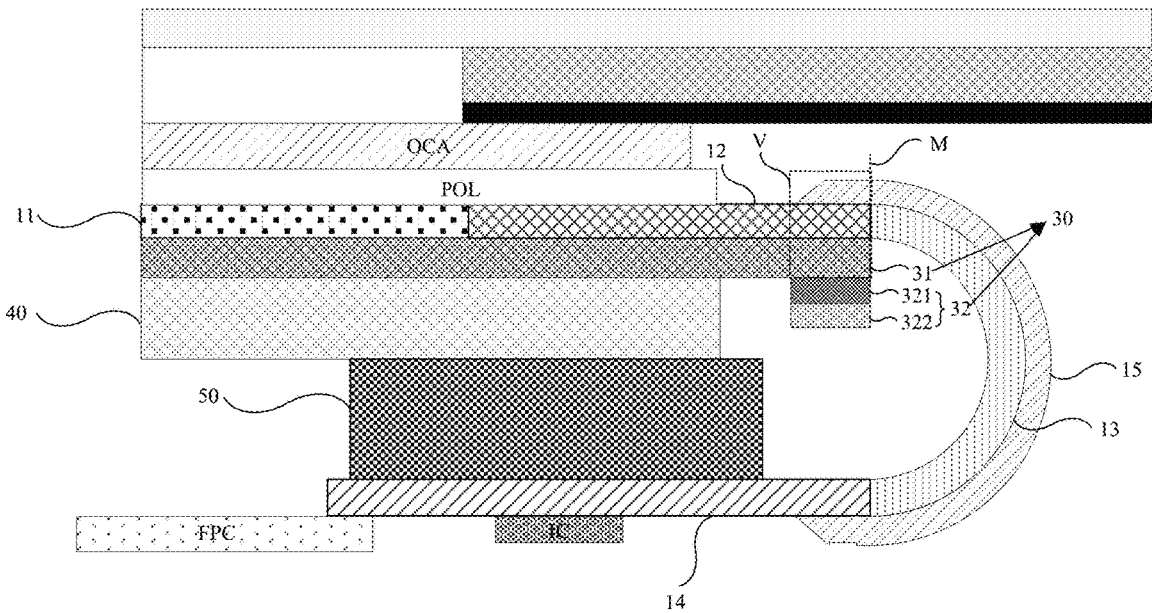
FIG. 4B is a schematic diagram of the display module shown in FIG. 4A after being bent at the bending part.

As shown in FIG. 4A, the first supporting structure 32 is on a side of the first bearing film 31 away from the fan-out part 12, and an orthographic projection of the first supporting structure 32 on the flexible display panel 10 is within a region where the fan-out part 12 is located and at an end away from the display part 11. As shown in FIG. 4B, which illustrates a state of the display module of FIG. 4A after being bent along the bending start position M), the first supporting structure 32 can support the flexible display panel 10 (e.g., the fan-out part 12 within the dashed-line box V) thereon so that the flexible display panel 10 is not deformed in the bent state, thereby ensuring the reliability of the display image.

In the absence of the first supporting structure 32, the bending part 13 and the stress compensation layer 15 with a certain thickness H1 thereon produce a large stress at the bending starting position M in the bent state as shown in FIG. 4B, which easily drives the first bearing film 31 (for example, a portion of the first bearing film 31 in the region where the dashed-line box V is located) that is thin to deform, and thus drives the fan-out part 12 (for example, a portion of the fan-out part 12 in the dashed-line box V) to deform together, so that the inorganic layer in the fan-out part 12 at this position is torn, the signal traces are broken, and defects occur in the display image. Accordingly, in the embodiments of the present application, by providing the first supporting structure 32 in the display module 100, the fan-out part 12 (for example, the portion of the fan-out part 12 in the dashed-line box V) can be supported to prevent deformation when the bending part 13 is bent at the bending start position M, thereby ensuring reliability of the display image.

As can be seen from the above, the first bearing film 31 is disposed in the display module 100 to support the display part 11 and the fan-out part 12 of the flexible display panel 10 and thus prevent the display part 11 and the fan-out part 12 from being deformed. In addition, by providing the first supporting structure 32 in the display module 100, the fan-out part 12 (for example, the portion of the fan-out part 12 in the dashed-line box V) can be further supported, so that the fan-out part 12 is prevented from being deformed by a large stress produced at the bending start position M when the display module 100 is bent, thereby ensuring the reliability of the display image.

In some embodiments of the present application, as shown in FIG. 4A or 4B, the first supporting structure 32 may include a first ultraviolet adhesive 321 and a first covering layer 322. The first ultraviolet adhesive 321 is between the first covering layer 322 and the first bearing film 31, and may attach the first covering layer 322 to the first bearing film 31. The first covering layer 322 can well support the fan-out part 12 located thereon (e.g., the portion of the fan-out part 12 in the dashed-line box V).

In some embodiments of the present application, the adhesive layer constituting the first ultraviolet adhesive 321 may include an ultraviolet viscosity-enhanced adhesive, which has a viscosity increasing under the irradiation of ultraviolet light. In other embodiments of the present application, the adhesive layer constituting the first ultraviolet adhesive 321 may include an ultraviolet viscosity-reduced adhesive, which has a viscosity decreasing under the irradiation of ultraviolet light. Exemplarily, the ultraviolet viscosity-enhanced adhesive may include a photoinitiator and acrylate, a cross-linking reaction of the acrylate occurs under the irradiation of ultraviolet light, so that the viscosity of the ultraviolet viscosity-enhanced adhesive increases. In addition, for the ultraviolet viscosity-reduced adhesive, the viscosity reduction under the irradiation of ultraviolet light can be realized solely by controlling the components and the proportions of materials participating in the reaction, and the basic principle of reaction is similar to that of the ultraviolet viscosity-enhanced adhesive. The process of forming the first ultraviolet adhesive using the ultraviolet viscosity-enhanced adhesive or the ultraviolet viscosity-reduced adhesive will be described in detail later in the method of preparing the bearing structure 30, and will not be described in detail herein.

In some embodiments of the present application, as shown in FIG. 4A, the thickness H3 of the first ultraviolet adhesive 321 may have a range as follows: $10 \ \mu m \leq H3 \leq 30 \ \mu m$. When the thickness H3 of the first ultraviolet adhesive 321 is less than 10 µm, the first ultraviolet adhesive 321 is too thin to attach the first bearing film 31 to the first covering layer 322 firmly. When the thickness H3 of the first ultraviolet adhesive 321 is greater than 30 µm, the first ultraviolet adhesive 321 is so thick that the fabrication cost increases. When the thickness H3 of the first ultraviolet adhesive 321 ranges from 10 µm to 30 µm, the first bearing film 31 can be attached to the first covering layer 322 firmly, and the cost is low.

In addition, the material of the first covering layer 322 is not specifically limited in the embodiments of the present application. Exemplarily, the material of the first covering layer 322 may be one or more of PI, PET, polyolefin (PO) and polymethyl methacrylate (PMMA).

In some embodiments of the present application, as shown in FIG. 4A, the thickness H4 of the first covering layer 322 may have a range as follows: $50 \ \mu m \leq H4 \leq 150 \ \mu m$. When the thickness H4 of the first covering layer 322 is less than 50 µm, the first covering layer 322 is too thin to well support the fan-out part 12 when the bending part 13 is in the bent state. When the thickness H4 of the first covering layer 322 is greater than 150 µm, the first covering layer 322 is so thick that the fabrication cost increases and it is not favorable for the light and thin design of the display device. Exemplarily, the thickness H4 of the first covering layer 322 may be 60 µm, 80 µm, 100 µm, 120 µm, or 140 µm. As such, the first covering layer 322 not only can well support the fan-out part 12 when the bending part 13 is in the bent state, but also has a lower cost and realizes the light and thin design of the display device.

In order to improve the mechanical strength of the display module 100, in some embodiments of the present application, as shown in FIG. 4A or 4B, the display module 100 may further include a mechanical strength enhancement layer 40. The mechanical strength enhancement layer 40 is located on a side of the first bearing film 31 away from the display part 11 and the fan-out part 12, and an orthographic projection of the mechanical strength enhancement layer 40 on the flexible display panel 10 does not overlap with an orthographic projection of the first supporting structure 32 on the flexible display panel 10. As such, with the arrangement of the mechanical strength enhancement layer 40 in the display module 100, the mechanical strength of the display module 100 can be improved, and meanwhile, the area where the bending part 13 is located can be subjected to a patterning process to improve the deformation and recovery effects of the bending part 13.

In addition, in order to control the bending radius of the bending part 13 and enhance the reliability of the deformation, in some embodiments of the present application, as shown in FIG. 4A, the display module 100 further includes a spacer layer 50. In the bent state of the display module 100, as shown in FIG. 4B, the spacer layer 50 may be located between the mechanical strength enhancement layer 40 and the bonding part 14, and coupled to the mechanical strength enhancement layer 40 and the bonding part 14. As such, by providing the spacer layer 50 having a certain thickness in the display module 100, the bending radius of the bending part 13 can be controlled, and the reliability of the deformation can be enhanced.

It should be noted that, in the embodiments of the present application, the material and thickness of the mechanical strength enhancement layer 40 are not specifically limited, and the specific thickness thereof depends on the thickness of the first bearing film 31 and the like. In addition, the material and the thickness of the spacer layer 50 are not specifically limited in the embodiments of the present application, and the specific thickness thereof depends on the bending radius of the bending part 13 and the like.

In some embodiments of the present application, as shown in FIG. 4A, the display module 100 may further include a polarizer (POL) 60, an optically clear adhesive (OCA) 80 and a cover plate 70, which are located on the light emitting side of the flexible display panel 10 and disposed sequentially away from the flexible display panel 10. The OCA 80 is disposed between the polarizer 60 and the cover plate 70, and may attach the polarizer 60 to the cover plate 70. The polarizer 60 is capable of transmitting light rays emitted from the flexible display panel 10 which have a vibration direction parallel to the transmission axis of the polarizer 60, and absorbing light rays emitted from the flexible display panel 10 which have a vibration direction perpendicular to the transmission axis of the polarizer 60. The cover plate 70 may protect the display module 100.

Further, as shown in FIG. 4A, the cover plate 70 may include a transparent cover plate 71, a light-shielding cover plate 72, and a protective plate 73. The transparent cover plate 71 is disposed on a side of the OCA 80 away from the polarizer 60, and is attached to the OCA 80, and an orthographic projection of the transparent cover plate 71 on the flexible display panel 10 is located in a region where the display part 11 is located. Therefore, the light emitted from each subpixel P in the display part 11 can exit after passing through the transparent cover plate 71. The light-shielding cover plate 72 is disposed on a side of the OCA 80 away from the polarizer 60, and an orthographic projection of the light-shielding cover plate 72 on the flexible display panel 10 is located at least in a region where the fan-out part 12 and the bending part 13 are located, and a portion of the light-shielding cover plate 72 is attached to the OCA 80. By providing the light-shielding cover plate 72 in the display module 100, a light-shielding effect can be achieved for the signal traces in the fan-out part 12 and the bending part 13, thereby avoiding light leakage of the display module 100 and improving the display effect. The protective plate 73 is disposed on a side of the transparent cover plate 71 and the light-shielding cover plate 72 away from the OCA 80, and is coupled to the transparent cover plate 71 and the light-shielding cover plate 72, so as to protect the transparent cover plate 71 and the light-shielding cover plate 72.

In some embodiments of the present application, as shown in FIG. 4A, the light-shielding cover plate 72 may include a light-shielding protective layer 721 and a light-shielding layer 722 which are stacked. The light-shielding protective layer 721 is coupled to the protective plate 73 to protect the light-shielding layer 722. The light-shielding layer 722 mainly plays a role of shielding light and is made of an opaque material.

It should be noted that, the transparent cover plate 71 or the protective plate 73 may be made of transparent glass, sapphire, or a transparent resin material. The term "transparent substrate" in the embodiments of the present application means that the light transmittance of the transparent substrate 50 may be 85% or more. The transparent cover plate 71 and the protective plate 73 may have the same transmittance as or different transmittances from the transparent substrate. The opaque material forming the light-shielding layer 722 may be ink, molybdenum oxide, or the like.

It should be noted that, in the following drawings, the polarizer 60, the cover plate 70, and the like on the light emitting side of the flexible display panel 10 are omitted in order to simplify the drawings.

Figure 5A:
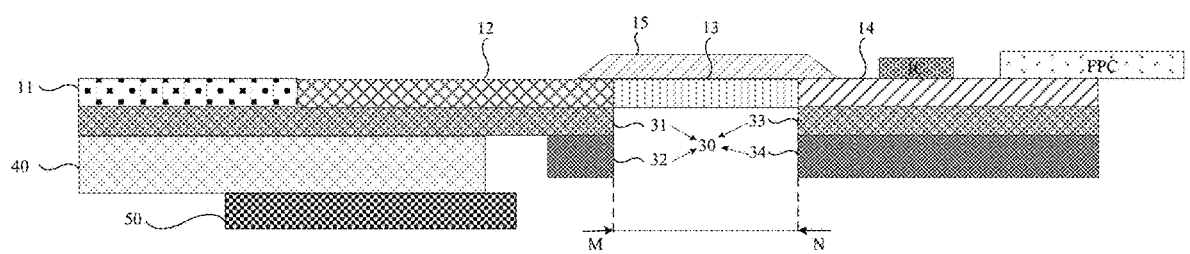
FIG. 5A is a schematic structural diagram of a display module according to an embodiment of the present disclosure.

On the basis, in some embodiments of the present application, in order to avoid a phenomenon that the deformation occurs in the bonding part 14 when the bending part 13 is in the bent state and thus the signal traces at such a position are torn and broken to lead to display defects, as shown in FIG. 5A, the bearing structure 30 may further include a second bearing film 33, a second supporting structure 34, and an opening MN between the first bearing film 31 and the second bearing film 33. The bending part 13 is located at the position of the opening MN. The second bearing film 33 is located on the side of the bonding part 14 away from the driving IC, and is coupled to the bonding part 14. The second supporting structure 34 is located on the side of the second bearing film 33 away from the bonding part 14.

Figure 5B:
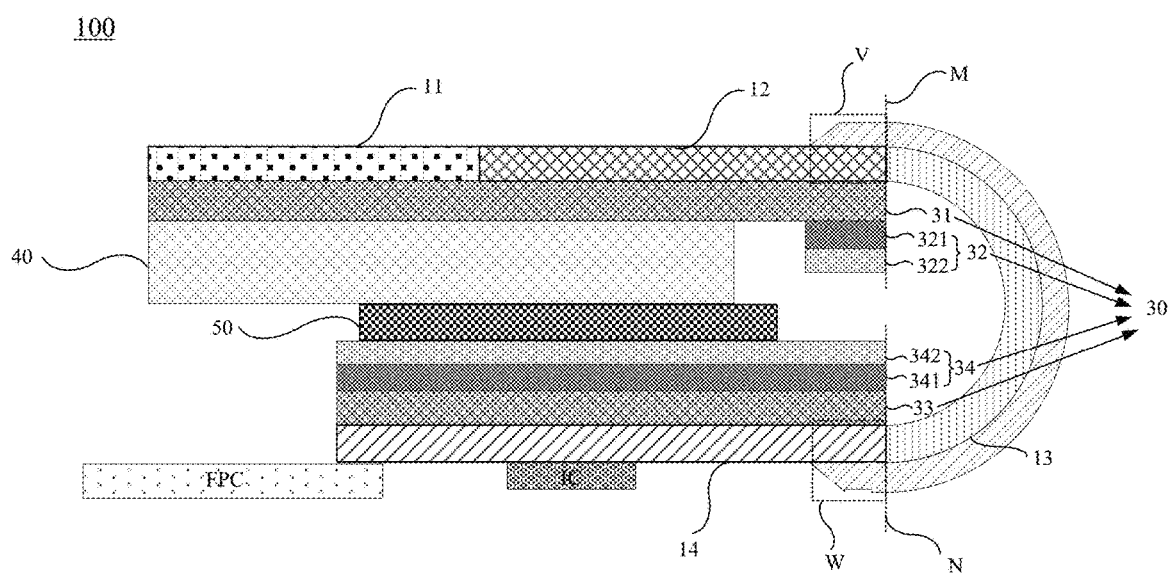
FIG. 5B is a schematic diagram of the display module shown in FIG. 5A after being bent at the bending part.

As such, by providing the second bearing film 33 and the second supporting structure 34 in the display module 100, the bonding part 14 can be supported, and situations in which a large stress produced at the bending end position N (as shown in FIG. 5B) of the bending part 13 drives the thin second bearing film 33 (for example, a portion of the second bearing film 33 in the dashed-line box W) to deform, further drives the bonding part 14 to deform, then adversely affects the bonding between the signal traces in the bonding part 14 and the driving IC or the FPC and thus causes display defects are avoided.

It should be noted that, the first bearing film 31 and the second bearing film 33 may be made of the same or different materials. When the first bearing film 31 and the second bearing film 33 are made of the same material, the first bearing film 31 and the second bearing film 33 may be made from the same back film in order to simplify the process, and the detailed process will be stated later and not be described herein. The following embodiments are each explained and described by taking a case where the first bearing film 31 and the second bearing film 33 have the same material as an example.

In some embodiments of the present application, as shown in FIG. 5B, the second supporting structure 34 may include a second ultraviolet adhesive 341 and a second covering layer 342. The second ultraviolet adhesive 341 is located between the second covering layer 342 and the second bearing film 33, and may attach the second covering layer 342 to the second bearing film 33. The second covering layer 342 may support the bonding part 14. In addition, the spacer layer 50 is between the mechanical strength enhancement layer 40 and the second covering layer 342. In this case, since the second ultraviolet adhesive 341 and the second covering layer 342 have a certain thickness, the thickness of the spacer layer 50 for controlling the bending radius can be reduced, thereby reducing the cost.

It should be noted that, the second ultraviolet adhesive 341 may be the same as or different from the first ultraviolet adhesive 321 in composition and structure. Similarly, the second covering layer 342 may be the same as or different from as the first covering layer 322 in composition and structure. When the composition of the second ultraviolet adhesive 341 is the same as that of the first ultraviolet adhesive 321, and the composition of the second covering layer 342 is the same as that of the first covering layer 322, the second ultraviolet adhesive 341 and the first ultraviolet adhesive 321, and the second covering layer 342 and the first covering layer 322 may be manufactured by using the same back film, which is simple in process and low in cost. The specific fabrication process will be described later, and will not be described here. The embodiments of the present application are all explained and described by taking a case where the second ultraviolet adhesive 341 and the first ultraviolet adhesive 321 have the same composition and structure, and the second covering layer 342 and the first covering layer 322 have the same composition and structure as an example.

Figure 6:
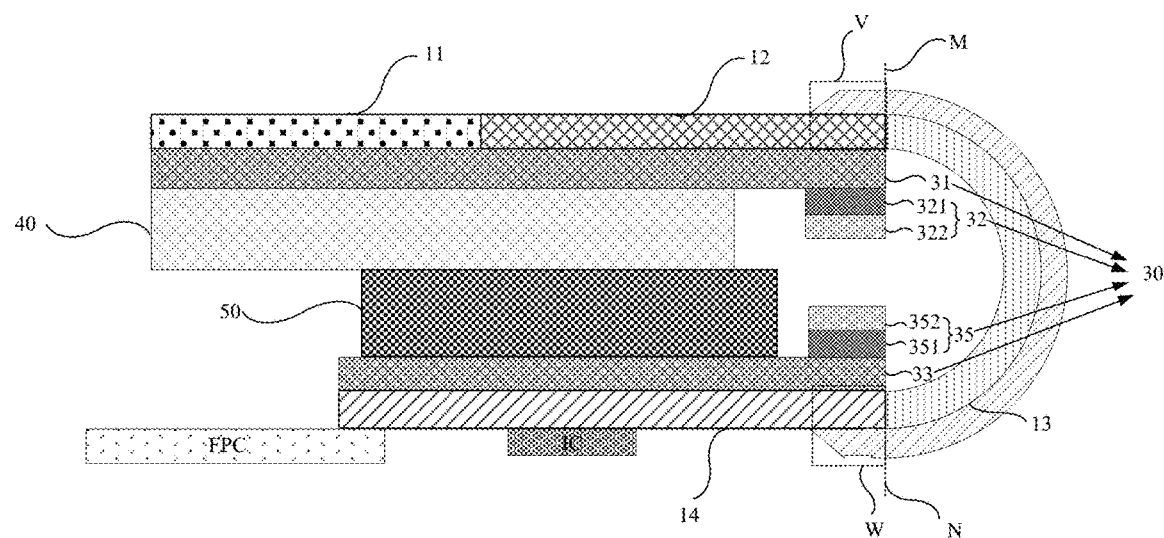
FIG. 6 is a cross-sectional view, taken along the Z-Z direction, of the display module shown in FIG. 3B after being bent at the bending part.

In other embodiments of the present application, as shown in FIG. 6, in order to avoid a phenomenon that the deformation occurs in the thin second bearing film 33 (e.g., the portion of the second bearing film 33 in the dashed-line box W) when the bending part 13 is in the bent state and then the bonding part 14 (e.g., a portion of the bonding part 14 in the dashed-line box W) is deformed and thus the signal traces at such a position are torn and broken to lead to display defects, the bearing structure 30 may further include a third supporting structure 35. The third supporting structure 35 is located on a side of the second bearing film 33 away from the bonding part 14 (e.g., the portion of the bonding part 14 in the dashed-line box W), and may support the portion of the bonding part 14 in the dashed-line box W, so as to prevent the signal traces in the portion of the bonding part 14 in the dashed-line box W from being torn and broken in the bent state, thereby ensuring the reliability of the display image.

On this basis, as shown in FIG. 6, the third supporting structure 35 may include a third ultraviolet adhesive 351 and a third covering layer 352. The third ultraviolet adhesive 351 is located between the third covering layer 352 and the second bearing film 33, and may attach the third covering layer 352 to the second bearing film 33. The third covering layer 352 may support the bonding part 14. In addition, the spacer layer 50 is between the mechanical strength enhancement layer 40 and the second bearing film 33.

As can be seen from the above, by providing the third supporting structure 35 in the display module 100, the bonding part 14 (especially, the portion of the bonding part 14 in the dashed-line box W) can be supported, so as to avoid a situation in which the bonding part 14 at such a position is deformed and thus the signal traces are broken to lead to display defects.

It should be noted that, the third ultraviolet adhesive 351 may be the same as or different from the first ultraviolet adhesive 321 in composition and structure. Similarly, the third covering layer 352 may be the same as or different from the first covering layer 322 in composition and structure, the detailed description of which is similar to that described above and is not repeated herein. The embodiments of the present application are all explained and described by taking a case where the third ultraviolet adhesive 351 and the first ultraviolet adhesive 321 have the same composition and structure, and the third covering layer 352 and the first covering layer 322 have the same composition and structure as an example.

Figure 7:
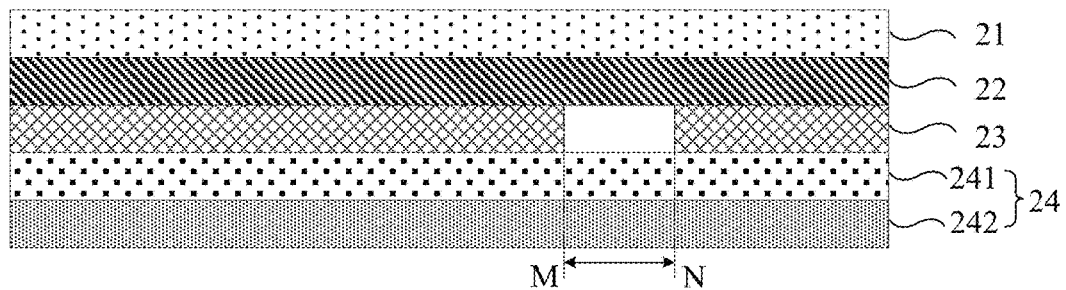
FIG. 7 is a schematic structural diagram of a back film according to an embodiment of the present disclosure.

In order to form the above-mentioned bearing structure 30 of the display module 100, some embodiments of the present disclosure provide a back film 20 as shown in FIG. 7, and the structure of the back film 20 and the method for making the back film 20 into the above-mentioned bearing structure 30 are described in detail below.

As shown in FIG. 7, the back film 20 may include a release film 21, an adhesive layer 22, a first film layer 23, and a second film layer 24, which are sequentially stacked. The adhesive layer 22 may attach the release film 21 to the first film layer 23, and the second film layer 24 may be coupled to the first film layer 23. The release film 21 can protect the first film layer 23 from external contamination and damage.

In some embodiments of the present application, in a case where the above-mentioned bearing structure 30 includes the first bearing film 31 and the first supporting structure 32, the first film layer 23 may be used for forming the first bearing film 31, and the second film layer 24 may be used for forming the first supporting structure 32. Further, in a case where the first supporting structure 32 includes the first covering layer 322 and the first ultraviolet adhesive 321, the second film layer 24 may include a protective film 242 and an ultraviolet adhesive layer 241 which are stacked as shown in FIG. 7. The protective film 242 may form the first covering layer 322, and the ultraviolet adhesive layer 241 may form the first ultraviolet adhesive 321.

It should be noted that, in some embodiments of the present application, the ultraviolet adhesive layer 241 may be an ultraviolet viscosity-enhanced adhesive as mentioned above, which has a viscosity increasing under the irradiation of ultraviolet light. In other embodiments of the present application, the ultraviolet adhesive layer 241 may be an ultraviolet viscosity-reduced adhesive, which has a viscosity decreasing under the irradiation of ultraviolet light. The basic principle that the viscosity of the ultraviolet adhesive layer 241 changes under the irradiation of ultraviolet light is as follows: the photoinitiator (or photosensitizer) in the ultraviolet adhesive layer 241 generates active free radicals or cations after absorbing ultraviolet light under the irradiation of ultraviolet light, and thus chemical reactions of monomer polymerization, crosslinking and grafting are initiated, so that the adhesive is converted from liquid state to solid state within several seconds.

The method for fabricating the display module 100 is described in detail below, and the bearing structure 30 in the display module 100 may be manufactured by using the above-mentioned back film 20. In this case, the bearing structure 30 includes a first bearing film 31 and a first supporting structure 32, and the first supporting structure 32 includes a first ultraviolet adhesive 321 and a first covering layer 322. The method includes steps S101 to S106.

Figure 8:
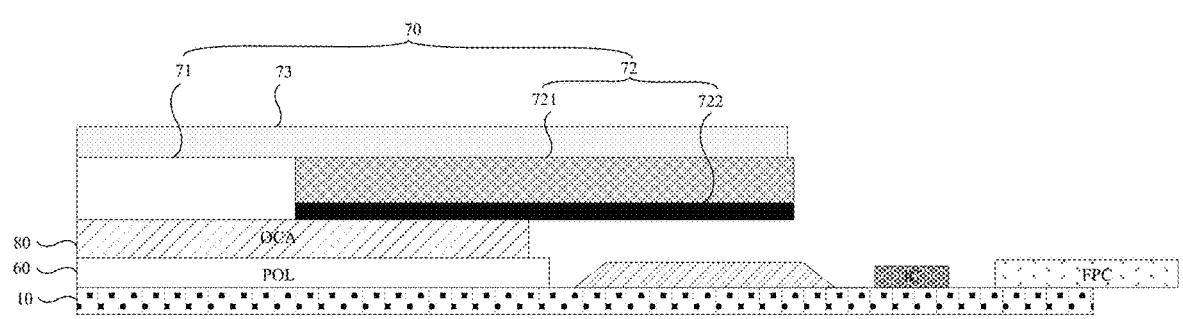
FIG. 8 is a cross-sectional view of the display module shown in FIG. 3B taken along the Z-Z direction.

In step S101, the flexible display panel 10 and a film layer on the flexible display panel 10 are prepared. Specifically, as shown in FIG. 8, the flexible display panel 10, and the polarizer 60, the cover plate 70, the OCA 80, the driving IC, the FPC, and other structures on the flexible display panel 10 are prepared. The embodiments of the present application do not describe this process in detail, and reference may be made to related technologies.

Figure 9:
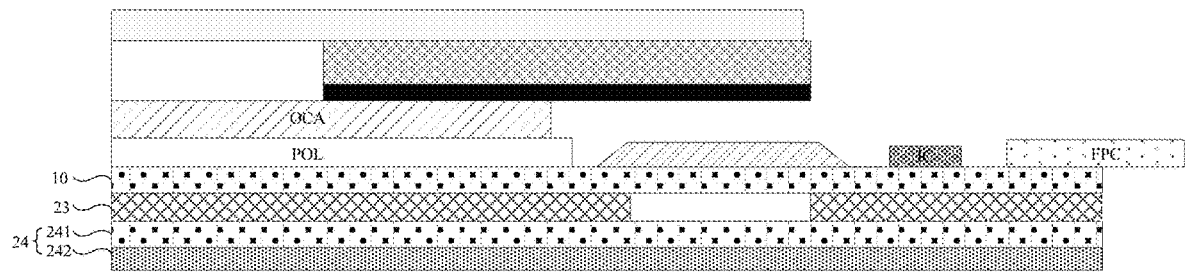
FIG. 9 is a cross-sectional view of the display module shown in FIG. 3B taken along the Z-Z direction.

In step S102, the back film 20 is attached. Specifically, as shown in FIG. 9, the release film 21 and the adhesive layer 22 of the back film 20 are removed, and the first film layer 23 is attached to the non-light-emitting side of the flexible display panel 10. In this way, the back film 20 may be provided on the non-light-emitting side of the flexible display panel 10 to support the flexible display panel 10.

In step S103, ultraviolet light irradiation with a mask is performed.

Figure 10A:
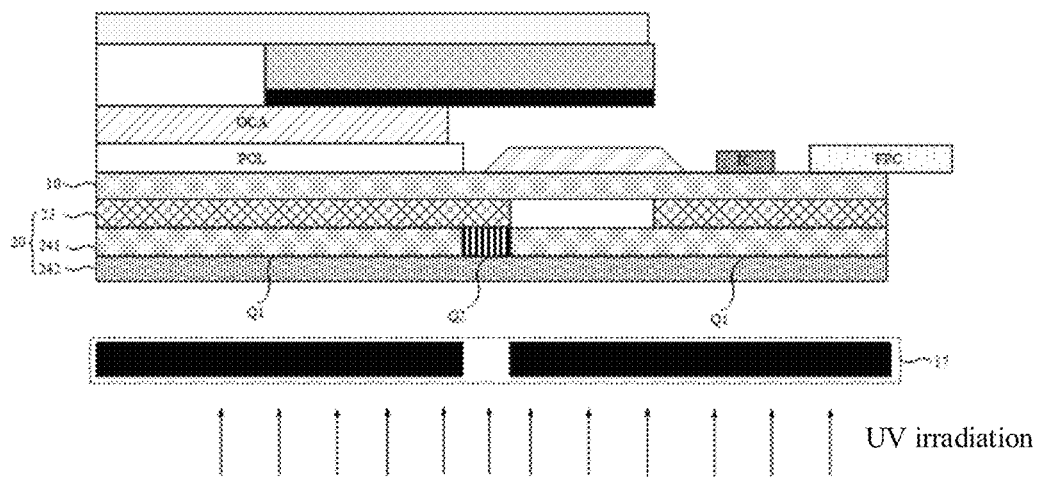
FIG. 10A is a diagram illustrating a method for ultraviolet irradiation of a back film according to an embodiment of the present application.

In some embodiments of the present application, in a case where the ultraviolet adhesive layer 241 is an ultraviolet viscosity-enhanced adhesive, as shown in FIG. 10A, the first light-shielding plate 17 may be used as a mask for the back film 20 when the ultraviolet light irradiates the side of the back film 20 away from the flexible display panel 10, so that a first viscosity region Q1 and a second viscosity region Q2 are formed in the ultraviolet adhesive layer 241 after the back film 20 is subjected to the irradiation of ultraviolet light. Of the ultraviolet adhesive layer 241, a portion in the first viscosity region Q1 has a different viscosity from a portion in the second viscosity region Q2. Since the ultraviolet adhesive layer 241 is an ultraviolet viscosity-enhanced adhesive whose viscosity increases under the irradiation of ultraviolet light, the viscosity of the portion of the ultraviolet viscosity-enhanced adhesive in the first viscosity region Q1 is lower than that of the portion of the ultraviolet viscosity-enhanced adhesive in the second viscosity region Q2. In this case, the portion of the ultraviolet adhesive layer 241 in the second viscosity region Q2 is the first ultraviolet adhesive 321.

It should be noted that, in the embodiments of the present application, a specific material of the first light-shielding plate 17 is not limited, as long as the light leakage region of the first light-shielding plate 17 is used for forming the portion of the ultraviolet viscosity-enhanced adhesive in the second viscosity region Q2. In addition, specific parameters of the ultraviolet light irradiation are not limited in the embodiments of the application, as long as the optimal wavelength and energy of the to-be-absorbed light are determined according to the characteristics of the photoinitiator and a complete cross-linking reaction in the material after being irradiated is ensured. For example, the wavelength of the ultraviolet light is 365 nm, and the energy thereof is in a range of 300 mJ to 1000 mJ.

Figure 10B:
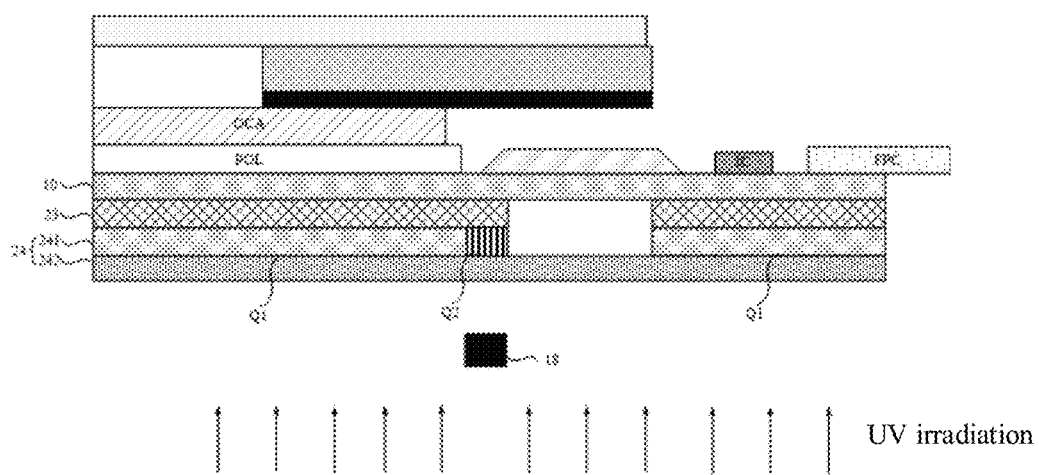
FIG. 10B is a diagram illustrating a method for ultraviolet irradiation of a back film according to an embodiment of the present application.

In other embodiments of the present application, in a case where the ultraviolet adhesive layer 241 is a ultraviolet viscosity-reduced adhesive, the second light-shielding plate 18 as shown in FIG. 10B may be used as a mask for the back film 20 during the ultraviolet light irradiation, and at this time, a first viscosity region Q1 and a second viscosity region Q2 are formed in the ultraviolet adhesive layer 241. Of the ultraviolet adhesive layer 241, a portion in the first viscosity region Q1 has a different viscosity from a portion in the second viscosity region Q2. Since the ultraviolet adhesive layer 241 is an ultraviolet viscosity-reduced adhesive whose viscosity decreases under the irradiation of ultraviolet light, the viscosity of the portion of the ultraviolet viscosity-reduced adhesive in the first viscosity region Q1 is lower than that of the portion of the ultraviolet viscosity-reduced adhesive in the second viscosity region Q2. In this case, the portion of the ultraviolet adhesive layer 241 in the second viscosity region Q2 is the first ultraviolet adhesive 321.

It should be noted that, in the embodiments of the present application, a specific material of the second light-shielding plate 18 is not limited, as long as the light shielding region of the second light-shielding plate 18 is used for forming the portion of the ultraviolet viscosity-reduced adhesive in the second viscosity region Q2.

In summary, no matter whether the ultraviolet light irradiation with a mask is performed in the manner shown in FIG. 10A or 10B, the viscosity of the portion of the ultraviolet adhesive layer in the first viscosity region Q1 is lower than that of the portion of the ultraviolet adhesive layer in the second viscosity region Q2.

Figure 11:
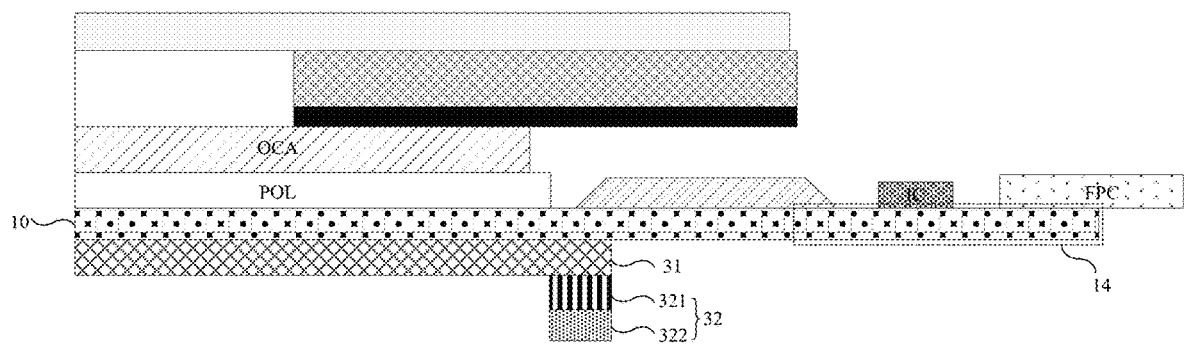
FIG. 11 is a cross-sectional view of the display module shown in FIG. 3B taken along the Z-Z direction.

In step S104, a first bearing film 31 and a first supporting structure 32 are formed. Specifically, as shown in FIG. 11, the portion of the ultraviolet adhesive layer 241 in the first viscosity region Q1 and a portion of the protective film 242 attached to the portion of the ultraviolet adhesive layer 241 in the first viscosity region Q1 are removed, and the portion of the ultraviolet adhesive layer 241 in the second viscosity region Q2 and a portion of the first film layer 23 attached to the portion of the ultraviolet adhesive layer 241 in the second viscosity region Q2 remain. In addition, a portion of the first film layer 23 coupled to the bonding part 14 is removed. The first film layer 23 remaining at this time forms the first bearing film 31. As such, the first bearing film 31 and the first supporting structure 32 shown in FIG. 11 are formed in the display module 100, where the first supporting structure 32 includes the first ultraviolet adhesive 321 and the first covering layer 322. The first covering layer 322 corresponds to a portion of the protective film 242 in contact with the portion of the ultraviolet adhesive layer 241 in the second viscosity region Q2 in FIGS. 10A and 10B.

Figure 12:
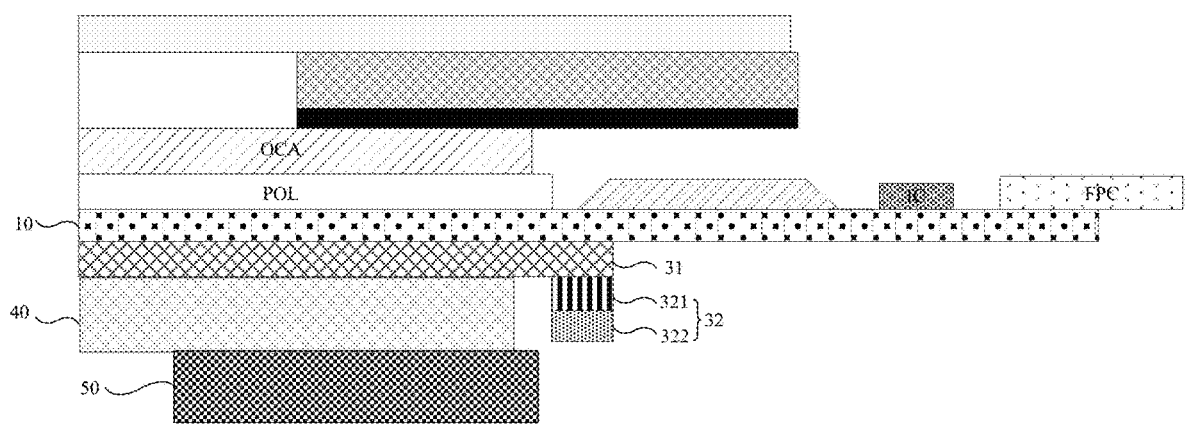
FIG. 12 is a cross-sectional view of the display module shown in FIG. 3B taken along the Z-Z direction.

In step S105, a mechanical strength enhancement layer 40 and a spacer layer 50 are attached. As shown in FIG. 12, the mechanical strength enhancement layer 40 and the spacer layer 50 are formed in a display module 100. In the embodiments of the present application, a method for forming the mechanical strength enhancement layer 40 and the spacer layer 50 in the display module 100 is not described in detail, and reference may be made to related technologies.

In step S106, the display module 100 is bent to form the display module 100 satisfying the narrow-bezel design as shown in FIG. 4B.

In addition, in some embodiments of the present application, in a case where the above-mentioned bearing structure 30 further includes the second bearing film 33, the second supporting structure 34 and the opening MN, and the second supporting structure 34 includes the second covering layer 342 and the second ultraviolet adhesive 341, the first film layer 23 may also be used for forming the second bearing film 33 and the opening MN, and the second film layer 24 may also be used for forming the second supporting structure 34. In particular, a portion of the protective film 242 in the second film layer 24 may be used for forming the second covering layer 342, and a portion of the ultraviolet adhesive layer 241 may be used for forming the second ultraviolet adhesive 341.

Figure 13A:
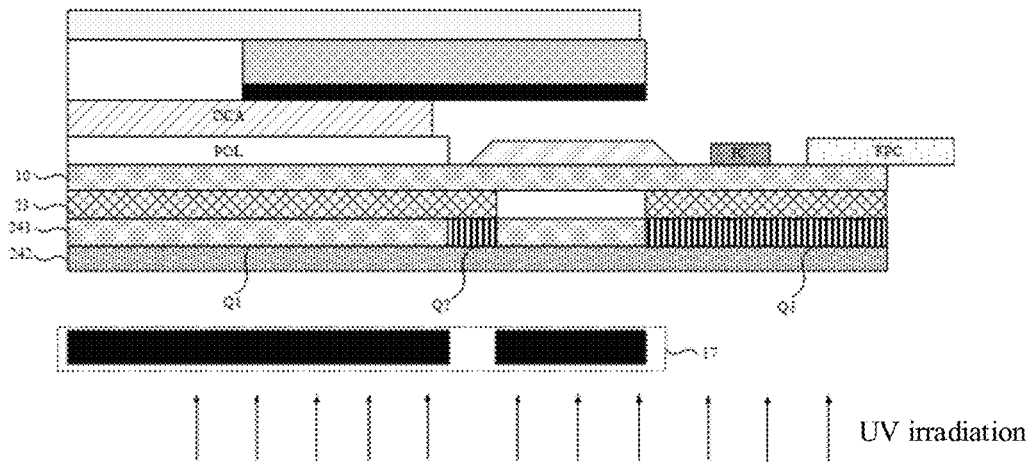
FIG. 13A is a diagram illustrating another example of a method for performing ultraviolet irradiation on the back film according to an embodiment of the present application.
Figure 13B:
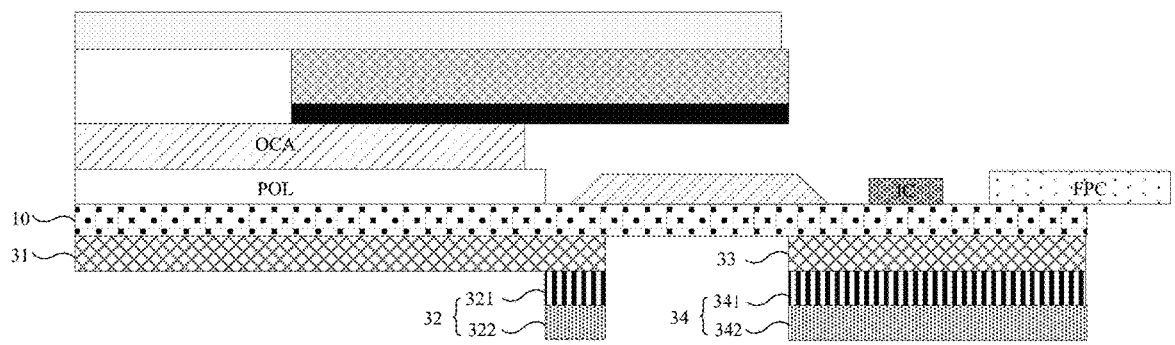
FIG. 13B is a cross-sectional view of the display module shown in FIG. 3B taken along the Z-Z direction.

In this case, instead of the above step S103, the step S103' of performing the ultraviolet light irradiation with a mask may be as follows: when the ultraviolet light irradiates the side of the back film 20 away from the flexible display panel 10, the first light-shielding plate 17 as shown in FIG. 13A may be used as a mask for the back film 20 during the irradiation of ultraviolet light, so that a first viscosity region Q1, a second viscosity region Q2 and a third viscosity region Q3 are formed in the ultraviolet adhesive layer 241. The explanation of the first viscosity region Q1 and the second viscosity region Q2 is similar to that described above, and is omitted herein. The viscosity of a portion of the ultraviolet adhesive layer 241 in the third viscosity region Q3 is the same as that of the portion of the ultraviolet adhesive layer 241 in the second viscosity region Q2. At this time, the portion of the ultraviolet adhesive layer 241 in the third viscosity region Q3 is the second ultraviolet adhesive 341. In this case, in addition to the same operation as step S104 described above, step S104' may further include remaining the second ultraviolet adhesive 341 and a portion of the protective film 242 attached to the second ultraviolet adhesive 341 and remaining a portion of the first film layer 23 coupled to the second ultraviolet adhesive 341, as shown in FIG. 13B, and in this case, a portion of the protective film 242 attached to the second ultraviolet adhesive 341 serves as the second covering layer 342, and the portion of the first film layer 23 attached to the second ultraviolet adhesive 341 serves as the second bearing film 33. The formation of the first bearing film 31 and the formation of the first bearing structure 32 are similar to those in step S104, and are not repeated herein.

Other steps (e.g., forming the flexible display panel 10 and the film layer structures thereon, attaching the back film 20, forming the mechanical strength enhancement layer 40 and the spacer layer 50, and performing a bending process) are similar to the above-mentioned processes such as steps S101, S102, S105 and S106, which are not repeated herein, and finally the display module 100 shown in FIG. 5B is formed.

In other embodiments of the present application, in a case where the above-mentioned bearing structure 30 further includes the second bearing film 33, the third supporting structure 35 and the opening MN, and the third supporting structure 35 includes the third covering layer 352 and the third ultraviolet adhesive 351, the first film layer 23 may also be used for forming the second bearing film 33 and the opening MN. The second film 24 may also be used for forming the third supporting structure 35, the protective film 242 of the second film 24 may also be used for forming the third covering layer 352, and the ultraviolet adhesive layer 241 may also be used for forming the third ultraviolet adhesive 351.

Figure 14A:
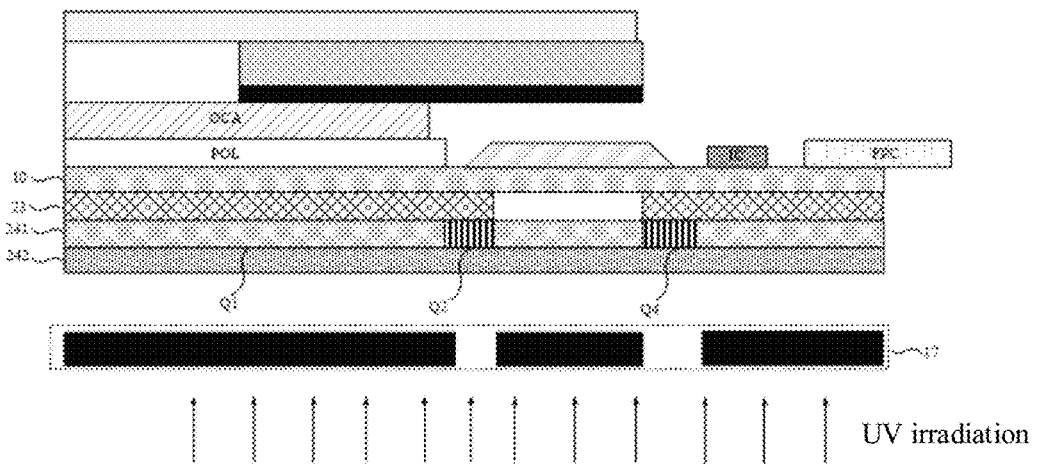
FIG. 14A is a diagram illustrating another example of a method for performing ultraviolet irradiation on the back film according to an embodiment of the present application.
Figure 14B:
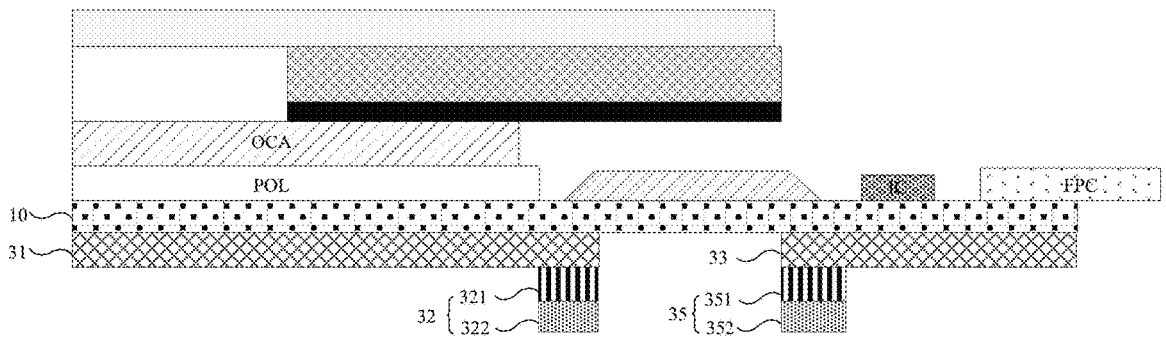
FIG. 14B is a cross-sectional view of the display module shown in FIG. 3B taken along the Z-Z direction.

In this case, step S103' of performing the ultraviolet light irradiation with a mask may be as follows: when the ultraviolet light irradiates the side of the back film 20 away from the flexible display panel 10, the first light-shielding plate 17 as shown in FIG. 14A may be used as a mask for the back film 20 during the irradiation of ultraviolet light, so that a first viscosity region Q1, a second viscosity region Q2 and a fourth viscosity region Q4 are formed in the ultraviolet adhesive layer 241. The explanation of the first viscosity region Q1 and the second viscosity region Q2 is similar to that described above, and is omitted herein. The viscosity of a portion of the ultraviolet adhesive layer 241 in the fourth viscosity region Q4 is the same as that of the portion of the ultraviolet adhesive layer 241 in the second viscosity region Q2. At this time, the portion of the ultraviolet adhesive layer 241 in the fourth viscosity region Q4 is the third ultraviolet adhesive 351. Step S104' may further include remaining the third ultraviolet adhesive 351 and a portion of the protective film 242 attached to the third ultraviolet adhesive 351 and remaining the first film layer 23 coupled to the third ultraviolet adhesive 351, as shown in FIG. 14B. In this case, the portion of the protective film 242 attached to the third ultraviolet adhesive 351 serves as the third covering layer 352, and the first film layer 23 attached to the third ultraviolet adhesive 351 serves as the second bearing film 33. The formation of the first bearing film 31 and the formation of the first bearing structure 32 are similar to those in step S104, and are not repeated herein.

Other steps (e.g., forming the flexible display panel 10 and the film layer structures thereon, attaching the back film 20, forming the mechanical strength enhancement layer 40 and the spacer layer 50, and performing a bending process) are similar to the above-mentioned processes such as steps S101, S102, S105 and S106, which are not repeated herein, and finally the display module 100 shown in FIG. 6 is formed.

It should be noted that, the embodiments corresponding to FIGS. 13A and 14A are explained and described by taking a case where the ultraviolet adhesive layer 241 is an ultraviolet viscosity-enhanced adhesive as an example, and the present application is not limited thereto. When the ultraviolet adhesive layer 241 is an ultraviolet viscosity-reduced adhesive, the difference in the fabrication method thereof is only in that different masks are selected in the step of performing the ultraviolet light irradiation with a mask, and other processes are similar to those described above, which are not repeated herein.

Figure 15A:
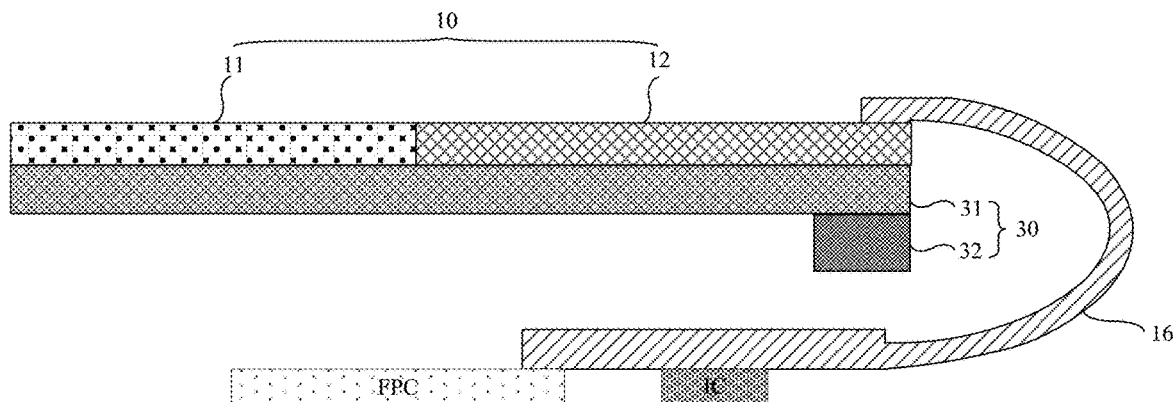
FIG. 15A is a schematic structural view of a display module according to an embodiment of the disclosure.

FIG. 15A shows a second structure of the display module 100 according to an embodiment of the present application. The structure of the display module shown in FIG. 15A differs from that of the display module shown in FIG. 3A mostly in that: as shown in FIG. 15A, the driving IC is directly coupled to a chip on film 16, and the portion of the chip on film 16 provided with the driving IC is bent to the non-light-emitting side of the flexible display panel 10 by using the bendability of the chip on film 16. In addition, in this example, the flexible display panel 10 only includes the display part 11 and the fan-out part 12, and there is no stress compensation layer 15 at the outer side of the bending part of the chip on film 16.

What the structures of the display module shown in FIG. 15A and the display module shown in FIG. 3A have in common is at least that, the display module 100 shown in FIG. 15A may also include the mechanical strength enhancement layer 40, the polarizer 60, the cover plate 70, and the like, which have the same functions as those in the above embodiments and are not repeated herein. In addition, in the following drawings, structures such as the polarizer 60 and the cover plate 70 on the flexible display panel 10 are omitted for the sake of simplification.

Figure 15B:
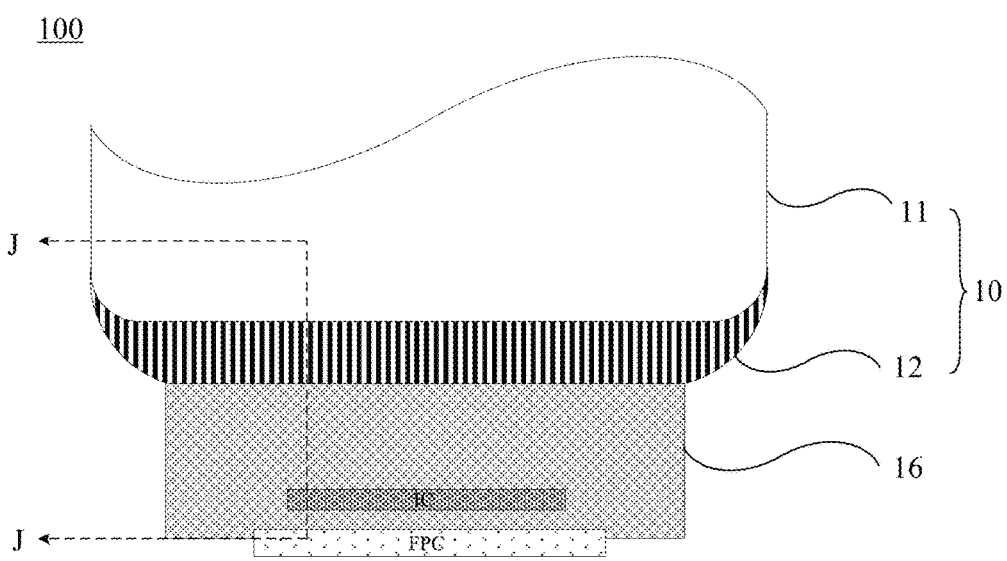
FIG. 15B is an expanded view of the display module shown in FIG. 15A.
Figure 16A:
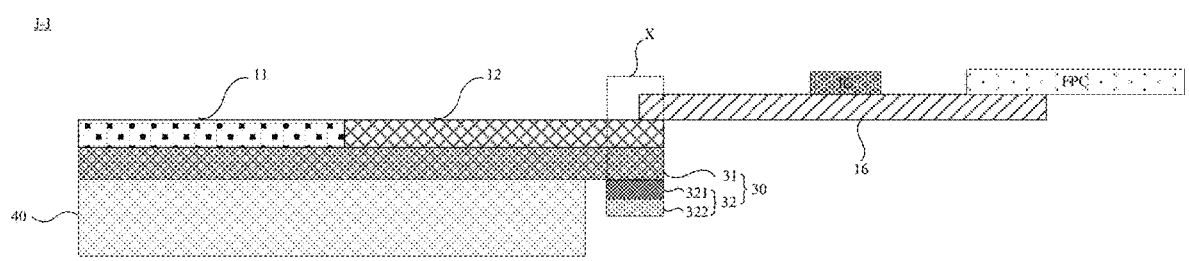
FIG. 16A is a cross-sectional view of the display module shown in FIG. 15B taken along a J-J direction.

FIG. 15B is an expanded view of the display module 100 of FIG. 15A. Specifically, as shown in FIG. 15B, the display module 100 may further include the above-mentioned chip on film 16. One end of the chip on film 16 is bonded to the fan-out part 12, and the other end of the chip on film 16 is configured to bond the driving IC and the FPC. FIG. 16A is a cross-sectional view of the display module shown in FIG. 15B taken along a J-J direction. As shown in FIG. 16A, an area where a portion of the chip on film 16 bonded to the fan-out part 12 is located overlaps with an orthographic projection of the first supporting structure 32 on the fan-out part 12. As such, when the chip on film 16 provided with the driving IC is bent to the non-light-emitting side of the flexible display panel 10 as shown in FIG. 16B in order to realize the narrow-bezel design of the display module 100, the first supporting structure 32 can support the fan-out part 12 (e.g., the portion of the fan-out part 12 in the dashed-line box X), thereby preventing the fan-out part 12 from being deformed and further ensuring the reliability of the display image.

Figure 16B:
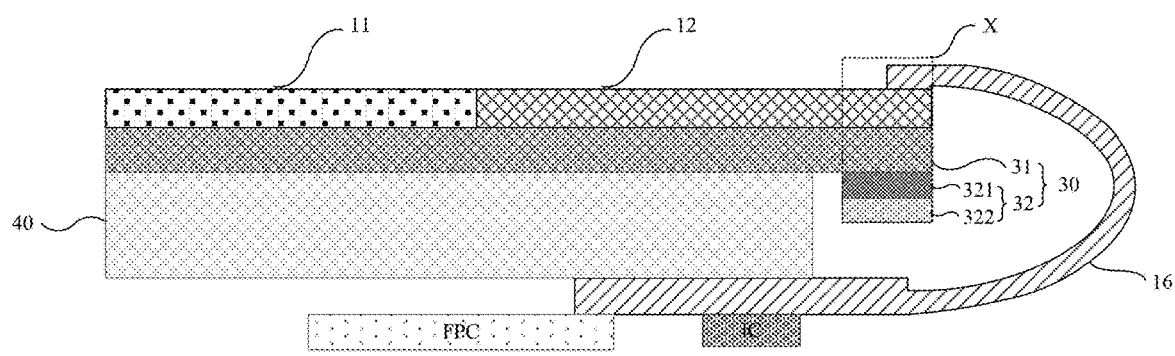
FIG. 16B is a schematic diagram of the display module shown in FIG. 16A after being bent.

The method for fabricating the display module 100 shown in FIG. 16B by using the back film 20 shown in FIG. 7 is similar to the method for fabricating the display module 100 shown in FIG. 4B by using the back film 20 shown in FIG. 7, and the description thereof is omitted herein. The difference therebetween is in that: in the fabrication of the display module 100 shown in FIG. 16B by using the back film 20 shown in FIG. 7, it does not need to form the spacer layer 50 in the display module 100, and the flexible display panel 10 does not need to be subjected to a bending process because the bending is achieved by using the bendability of the chip on film 16 in the display module shown in FIG. 16B.

It can be understood that the foregoing embodiments are merely exemplary embodiments used for describing the principle of the present disclosure, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:
1. A display module, comprising:
a flexible display panel comprising a display part and a fan-out part coupled to the display part; and
a bearing structure, comprising
a first bearing film at a non-light-emitting side of the flexible display panel, covering the display part and the fan-out part, and configured to bear the flexible display panel,
and a first supporting structure at a side of the first bearing film away from the flexible display panel, an orthographic projection of the first supporting structure on the flexible display panel being within an area where the fan-out part is located and at one end of the flexible display panel away from the display part, the first supporting structure being configured to support a portion of the fan-out part of the flexible display panel and a portion of the first bearing film,
wherein the first supporting structure comprises a first covering layer and a first ultraviolet adhesive,
the first ultraviolet adhesive is between the first covering layer and the first bearing film and configured to attach the first covering layer to the first bearing film, and is in contact with a surface of the first bearing film but in no contact with the flexible display panel, and
the first covering layer is in contact with the first ultraviolet adhesive but in en-no contact with the first bearing film, and end portions of the first covering layer are aligned with end portions of the first ultraviolet adhesive.

2. The display module of claim 1, further comprising: a bendable element, wherein the bendable element has a first end coupled to the fan-out part and a second end opposite to the first end and provided with a driving chip thereon, and is configured such that the driving chip is on the non-light-emitting side of the flexible display panel when the bendable element is in a bent state,
wherein the first supporting structure is on a portion of the first bearing film adjacent to the bendable element to support a portion of the fan-out part adjacent to the bendable element and the portion of the first bearing film adjacent to the bendable element.

3. The display module of claim 2, wherein
the flexible display panel further comprises:
a bonding part configured to bond the driving chip, and
a bending part between the bonding part and the fan-out part and coupled to the bonding part and the fan-out part, the bending part serving as the bendable element of the display module, the driving chip being on at least a portion of a first surface of the bonding part, and the bearing structure further comprises:
a second bearing film on a second surface of the bonding part opposite to the first surface, and configured to bear the bonding part;
a second supporting structure on a side of the second bearing film away from the bonding part, and configured to support the bonding part; and
an opening between the first bearing film and the second bearing film, wherein the opening is defined by a first side wall of the first bearing film and a second side wall of the second bearing film opposite to the first side wall of the first bearing film, and an orthographic projection of the opening on the flexible display panel covers the bending part.

4. The display module of claim 3, wherein the second supporting structure comprises:
a second covering layer, and
a second ultraviolet adhesive between the second covering layer and the second bearing film and configured to attach the second covering layer to the second bearing film.

5. The display module of claim 4, further comprising a mechanical strength enhancement layer on a side of the first bearing film away from the flexible display panel, wherein an orthographic projection of the mechanical strength enhancement layer on the flexible display panel does not overlap with the orthographic projection of the first supporting structure on the flexible display panel, and the mechanical strength enhancement layer is configured to support the flexible display panel.

6. The display module of claim 5, further comprising:
a spacer layer, which is between the mechanical strength enhancement layer and the second covering layer in a vertical direction in a case where the bending part is in the bent state.

7. The display module of claim 2, wherein the bendable element is a chip on film having one end bonded to a surface of the fan-out part at a light-emitting side of the flexible display panel, and the other end configured to bond the driving chip, and
wherein an orthographic projection of a portion of the chip on film, that is bonded to the fan-out part, on the fan-out part overlaps with an orthographic projection of the first supporting structure on the fan-out part.

8. The display module of claim 2, wherein the bendable element is a chip on film having one end bonded to a surface of the fan-out part at a light-emitting side of the flexible display panel, and the other end configured to bond the driving chip, and
wherein an orthographic projection of a portion of the chip on film, that is bonded to the fan-out part, on the fan-out part overlaps with an orthographic projection of the first supporting structure on the fan-out part.

9. The display module of claim 1, further comprising:
a polarizer and a cover plate on a light-emitting side of the flexible display panel and sequentially away from the flexible display panel.

10. A back film, comprising: a first film layer and a second film layer sequentially stacked and coupled to each other,
wherein the first film layer comprises a first portion and a second portion spaced apart from each other with a gap therebetween, and
the second film layer comprises a protective film and an ultraviolet adhesive layer that are stacked, the protective film is stacked at a side of the ultraviolet adhesive layer away from the first film layer, and a viscosity of the ultraviolet adhesive layer varies with ultraviolet irradiation.

11. The back film of claim 10, further comprising: an additional film layer adhering to a side of the first film layer away from the second film layer in a removable manner.

* * * * *